United States Patent [19]

Stern et al.

[11] Patent Number: 5,691,544
[45] Date of Patent: Nov. 25, 1997

[54] APPARATUS FOR OBTAINING THREE-DIMENSIONAL DATA FROM MULTIPLE PARTS OR DEVICES IN A MULTI-POCKETED TRAY

[75] Inventors: Howard Stern, Greenlawn; William E. Yonescu, Smithtown; Alex Mauro, Holbrook, all of N.Y.

[73] Assignee: Robotic Vision Systems, Inc., Hauppauge, N.Y.

[21] Appl. No.: 709,189

[22] Filed: Aug. 12, 1995

Related U.S. Application Data

[63] Continuation of Ser. No. 476,212, Jun. 7, 1995, Pat. No. 5,600,150, which is a continuation-in-part of Ser. No. 903,524, Jun. 24, 1992, Pat. No. 5,463,227.

[51] Int. Cl.$^6$ .................................................. G01N 21/86
[52] U.S. Cl. .................. 250/559.29; 250/559.3; 250/559.31; 250/559.4; 356/376
[58] Field of Search .................. 250/559.29–559.31, 250/559.34, 559.36, 559.4, 208.1; 356/376; 359/385, 386

[56] References Cited

U.S. PATENT DOCUMENTS

| | | | |
|---|---|---|---|
| 2,765,900 | 10/1956 | Seabrooke | 188/33 |
| 3,078,335 | 2/1963 | Black, Jr. | 174/136 |
| 3,355,590 | 11/1967 | Bartram | 250/202 |
| 3,525,872 | 8/1970 | Schneider | 250/219 |
| 3,853,395 | 12/1974 | Yevick | 353/27 |
| 3,881,605 | 5/1975 | Grossman | 214/1 |
| 3,907,439 | 9/1975 | Zanoni | 358/160 |
| 4,238,147 | 12/1980 | Stern | 358/376 |
| 4,238,780 | 12/1980 | Doemens | 340/146 |
| 4,351,437 | 9/1982 | Long | 209/545 |
| 4,529,316 | 7/1985 | DiMatteo | 356/376 |
| 4,576,482 | 3/1986 | Pryor | 358/376 |
| 4,590,367 | 5/1986 | Ross et al. | 250/208.1 |
| 4,594,001 | 6/1986 | DiMatteo et al. | 358/378 |
| 4,622,462 | 11/1986 | Eaton et al. | 250/238 |
| 4,677,302 | 6/1987 | Chiu et al. | 250/560 |
| 4,682,894 | 7/1987 | Schmidt et al. | 356/275 |
| 4,736,108 | 4/1988 | Comstock et al. | 250/559.34 |
| 4,738,330 | 4/1988 | Krufka | 250/560 |
| 4,739,175 | 4/1988 | Tamura | 250/559.34 |
| 4,770,533 | 9/1988 | Suwa | 356/375 |
| 4,809,839 | 3/1989 | Elliott | 198/796 |
| 4,811,409 | 3/1989 | Cavan | 382/8 |
| 4,853,880 | 8/1989 | Akamatsu et al. | 364/559 |
| 4,874,956 | 10/1989 | Kato et al. | 250/580 |
| 4,875,776 | 10/1989 | Pryor | 358/372 |
| 4,925,308 | 5/1990 | Stern et al. | 356/375 |
| 4,929,843 | 5/1990 | Chmielewski, Jr. et al. | 250/561 |

(List continued on next page.)

OTHER PUBLICATIONS

Appeal Brief dated Aug. 5, 1996 containing as an addendum *Robotic Vision Systems, Inc. v. View Engineering, Inc.*, _F. Supp. (CV 95–7441 LGB(AJWx), C.D. California (entered Mar. 5, 1996).

Primary Examiner—Stephone Allen
Attorney, Agent, or Firm—Morrison Law Firm

[57] ABSTRACT

Methods and arrangements are provided to efficiently use 3-D vision systems to measure selected features, of objects that are semi-constrained in compartmented trays having a uniform geometric arrangement. The methods are particularly well suited for optimizing the 3-D measurement of leads on integrated circuit devices which are packaged in trays. For obtaining the three-dimensional data, a multi-pocketed tray can be provided with tray pockets arranged in rows and columns, and corresponding sides of the multiple parts or devices in a row or column are scanned sequentially with at least one three dimensional sensor. This scanning procedure is repeated for all rows and columns containing sides of the devices from which data is to be obtained. The devices can be first aligned by applying directional vibration to the tray to drive all the parts or devices to the same corner or side of the respective pockets. The collected device geometry data is fed back to the manufacturing operation to control the parameters thereof.

8 Claims, 14 Drawing Sheets

U.S. PATENT DOCUMENTS

| | | | |
|---|---|---|---|
| 4,978,224 | 12/1990 | Kishimoto et al. | 358/394 |
| 4,981,372 | 1/1991 | Morimoto | 382/8 |
| 4,983,827 | 1/1991 | Ikagaya et al. | 250/559.34 |
| 4,991,968 | 2/1991 | Yonescu et al. | 356/376 |
| 5,027,281 | 6/1991 | Rekow et al. | 364/474.24 |
| 5,028,799 | 7/1991 | Chen et al. | 250/559.23 |
| 5,103,105 | 4/1992 | Ikegaya et al. | 250/561 |
| 5,124,582 | 6/1992 | Kawashima et al. | 250/548 |
| 5,139,338 | 8/1992 | Pomerantz et al. | 356/378 |
| 5,162,866 | 11/1992 | Tomiya et al. | 250/559.34 |
| 5,164,602 | 11/1992 | Lettang | 250/559.3 |
| 5,200,799 | 4/1993 | Maruyama et al. | 250/559.34 |
| 5,205,395 | 4/1993 | Bruno et al. | 198/389 |
| 5,263,567 | 11/1993 | Costa | 198/382 |
| 5,276,546 | 1/1994 | Palm et al. | 359/202 |
| 5,350,269 | 9/1994 | Azuma et al. | 414/416 |
| 5,463,227 | 10/1995 | Stern et al. | 250/559.29 |
| 5,600,150 | 2/1997 | Stern et al. | 250/559.3 |

APPARATUS FOR OBTAINING THREE-DIMENSIONAL DATA FROM MULTIPLE PARTS OR DEVICES IN A MULTI-POCKETED TRAY

This is a continuation of application Ser. No. 08/476,212, now U.S. Pat. No. 5,600,150, filed Jun. 7, 1995, which in turn is a continuation-in-part of application Ser. No. 07/903,524, now U.S. Pat. No. 5,463,227, filed Jun. 24, 1992.

BACKGROUND OF THE INVENTION

This present invention relates to increasing the utility of 3-D triangulation sensors which inherently take longer to gather data as their field of view is widened (at constant resolution) and applying the advantage to methodology and systems for improving quality of semiconductor device manufacture by controlling a semiconductor device fabrication unit with data acquired from manufactured devices thereby preventing recurrence in the manufacturing operation of device geometry deviation from an intended one.

The operation and application of 3-D triangulation sensors is well known in the art and is exemplified by U.S. Pat. Nos. 4,238,147, 4,590,367 and 5,028,799 which teach the relative motion between a sensor that projects a plane of light on an object whose surface data is to be recorded and the object itself. The plane of light may be formed by a collimated light beam, preferably a laser beam, spread by a cylindrical lens or by a spot of light which is deflected by a mirror mounted on a galvanometer, mechanical motion, spinning mirror, or acousto-optic deflector to form an equivalent plane made of a group of spots. The surface depth information is obtained by reading a signal for each part of the plane from a position sensing detector which may be a TV camera, a linear photodiode array, or a linear or area type photoconductive device which provides a voltage ratio proportional to the x and or y position of an incident light spot. All of these detectors and their use for range readout in 3-D triangulation systems are well known by those skilled in the art.

When a scanned spot is used to create the light plane and each spot is immediately read out from the detector, the scan time to scan a given area increases in proportion to the number of spots since a finite time is required to project each spot and to read out the data for each spot. When an integrating device such as a TV camera is used to gather the data from a projected plane (or equivalent group of spots) the width that can be accommodated is defined by the resolution of a pixel (often 1/512th of the length or width of the detector) and the corresponding resolution desired on the object. This follows from the typical camera pickup resolution created by a 512 by 512 pixel array. The readout time for the 3-D data contained in the projected plane corresponds to the time to read the picture frame which is normally 1/30th of a second. Thus, again, the number of 3-D points scanned and read out is limited by time available; typically 512 3-D points in 1/30th of a second.

3-D sensors are often translated via mechanical means which carry the sensor along its intended measurement path, often at a constant velocity. Any time the path is changed from a straight line or changes to a new straight line path, it is required that the mechanism be accelerated and/or decelerated which often slows the net scanning speed far below what would be achieved if acceleration were not required. This is particularly a problem when scanning around the periphery of a particular semiconductor device in a tray since it requires three changes of direction to scan leads on the four sides of the device.

Semiconductor devices generally will be fabricated in a machine fabrication operation since exact precision of manufactured devices is required to insure that, inter alia, such devices have an exact intended predetermined geometry. Although such mode of fabrication can produce high quality results, there occurs fabrication of some devices which have intended geometry deviations, e.g., in lead-to-lead spacing and coplanarity which are outside tolerances for acceptable devices. This requires inspection of the devices to ascertain that exacting precise fabrication has been accomplished. Where found, defective devices must be removed and discarded or refurbished to have the intended geometry.

It is desirable, therefore, that ways and means be provided so that an acquired data determination of device be used directly to control the fabrication unit operation to make compensation in the fabrication operation and unit as effectively eliminates production of defective devices.

OBJECTS AND SUMMARY OF THE INVENTION

It is the object of the present invention to significantly reduce the amount of data and time that must be used to scan objects in compartmented trays. A first reduction is implemented by changing the scan pattern from one that scans the four sides of an object (device) in sequence to a scan pattern that scans across the entire tray, either by row or by column, and covers the corresponding sides of the devices in that row or column. This significantly reduces the number of direction changes that are required and thus reduces the number of acceleration/deceleration cycles required and simultaneously reduces their importance since they are spaced much farther apart in both distance and time.

A further object of this invention is to significantly reduce the area that must be scanned as a result of the positional uncertainty created by devices that fit loosely in their pockets and therefore are free to shift significantly with respect to the scan area dimensions, thus requiring that excess area be scanned to insure covering the region of interest. The problem of positional uncertainty is solved via means that are introduced to bank the devices to the same known corner or side of their respective pockets through directional vibration that may be achieved by a combination of vertical vibration of the tray and gravity.

Another object is to provide a method and a system for effecting compensating control of a semiconductor device fabrication unit operation to effectively eliminate manufacturing defects in the semiconductor devices.

Briefly stated, there is provided methods and arrangements to efficiently use 3-D vision systems to measure selected features of objects that can be semi-constrained in compartmented trays having a uniform geometric arrangement, these methods being specially suited for 3-D measurement of leads on integrated circuit devices packaged in the trays. For obtaining three-dimensional data, the tray provided has pockets arranged in rows and columns in which the devices are received. Corresponding sides of the parts or devices in a tray row or column are scanned sequentially with at least one three-dimensional sensor. This scanning procedure is repeated for all rows and columns containing sides of the devices from which data is to be obtained. The devices can be first aligned by applying directional vibration to the tray to drive all the parts or devices to the same corner or side of the respective pockets. The collected device geometry data is fed back to a device manufacturing operation to control the parameters thereof.

According to an embodiment of the invention, there is provided that in the manufacture of semiconductor devices in a processor operated semiconductor fabrication unit and wherein the semiconductor devices have an intended predetermined geometry, a method of controlling the manufacture to insure producing the intended device geometry is employed which controlling method involves arranging manufactured ones of the semiconductor devices in rows and columns. Scanning sequentially with at least one sensor corresponding sides of at least first and second devices is carried out in a row or column to acquire three-dimensional device geometry data from the devices. Further scanning is then made of all other rows and columns of devices with the sensor to acquire additional three-dimensional device geometry data. The acquired three-dimensional device geometry data is then input to the processor for comparison thereof with the intended predetermined geometry to produce a signal indicative of any departure of an actual device geometry from intended geometry. This signal is output from the processor to the fabrication unit as a fabrication unit control effective to compensate fabrication unit operation to eliminate device geometry departure.

According to another embodiment of the invention, a system for manufacturing semiconductor devices and controlling the manufacture to insure precise intended predetermined device geometry is provided. This system comprises a semiconductor device fabrication unit operable to manufacture semiconductor devices, the manufactured devices being arranged in a disposition of rows and columns at the end of the fabrication unit. A processor for controlling operation of the fabrication unit is provided as is at least one sensor. Means are provided for scanning said sensor in a scanning course which scans corresponding sides of the devices in a row or column to acquire geometry data from the devices, the supporting means being operable for said sensor to move in a scanning course for further scanning all other rows and columns of device sides to acquire additional device geometry data. Means for comparing the acquired device geometry data with intended predetermined device geometry are provided and produce a signal indicative of any departure of actual device geometry from intended geometry. Means are provided to be responsive to said signal for adjusting parameters of the fabrication in a manner effective to compensate fabrication unit operation to eliminate geometry departure.

According to a further aspect of the invention, in the manufacture of semiconductor devices in a processor operated semiconductor fabrication unit, a method of controlling the manufacture to insure producing intended device geometry is provided in which method controlling involves receiving individual ones the devices in corresponding individual pockets of a tray said tray pockets being arranged in rows and columns of said pockets. Scanning sequentially with at least one three-dimensional sensor of corresponding sides of devices in a row or column of pockets is carried out to acquire three dimensional device geometry data from the devices. Further scanning the devices in all other rows and columns of pockets to acquire additional three-dimensional device geometry data from the devices is effected and the acquired three-dimensional device geometry data is input to a processor for comparison thereof with said intended predetermined geometry to produce a signal indicative of any departure of an actual device geometry from intended geometry. This signal is output from the processor to the fabrication unit as a fabrication unit control effective to compensate fabrication operation to eliminate the said device geometry departure.

According to a feature of the invention, there is provided a method for scanning devices having at least one of a row and a column of items to be scanned, comprising: aligning at least a first and a second of the devices with at least one row of items of the first and second devices, or at least one column of items of the first and second devices aligned with each other, scanning along the entire row or the entire column of the at least first and second devices, whereby all aligned items in the at least first and second devices are scanned in a single pass of the scanning, continuing the scanning until all desired items in the at least first and second devices are scanned, and controlling a fabrication device fabricating the devices according to data obtained by the scanning, whereby errors in the fabrication device are compensated.

According to a further feature of the invention, there is provided apparatus for scanning devices having at least one of a row and a column of items to be scanned, comprising: means for aligning at least a first and a second of the devices with at least one row of items of the first and second devices, or at least one column of items of the first and second devices aligned with each other, means for scanning along the entire row or the entire column of the at least first and second devices, whereby all aligned items in the at least first and second devices are scanned in a single pass of the scanning, means for continuing the scanning until all desired items in the at least first and second devices are scanned, and means for controlling a fabrication device fabricating the devices according to data obtained by the scanning, whereby errors in the fabrication device are compensated.

The above, and other objects, features and advantages of the present invention will become apparent from the following description read in conjunction with the accompanying drawings, in which like reference numerals designate the same elements.

DESCRIPTION OF THE PREFERRED EMBODIMENTS

Figure 1:
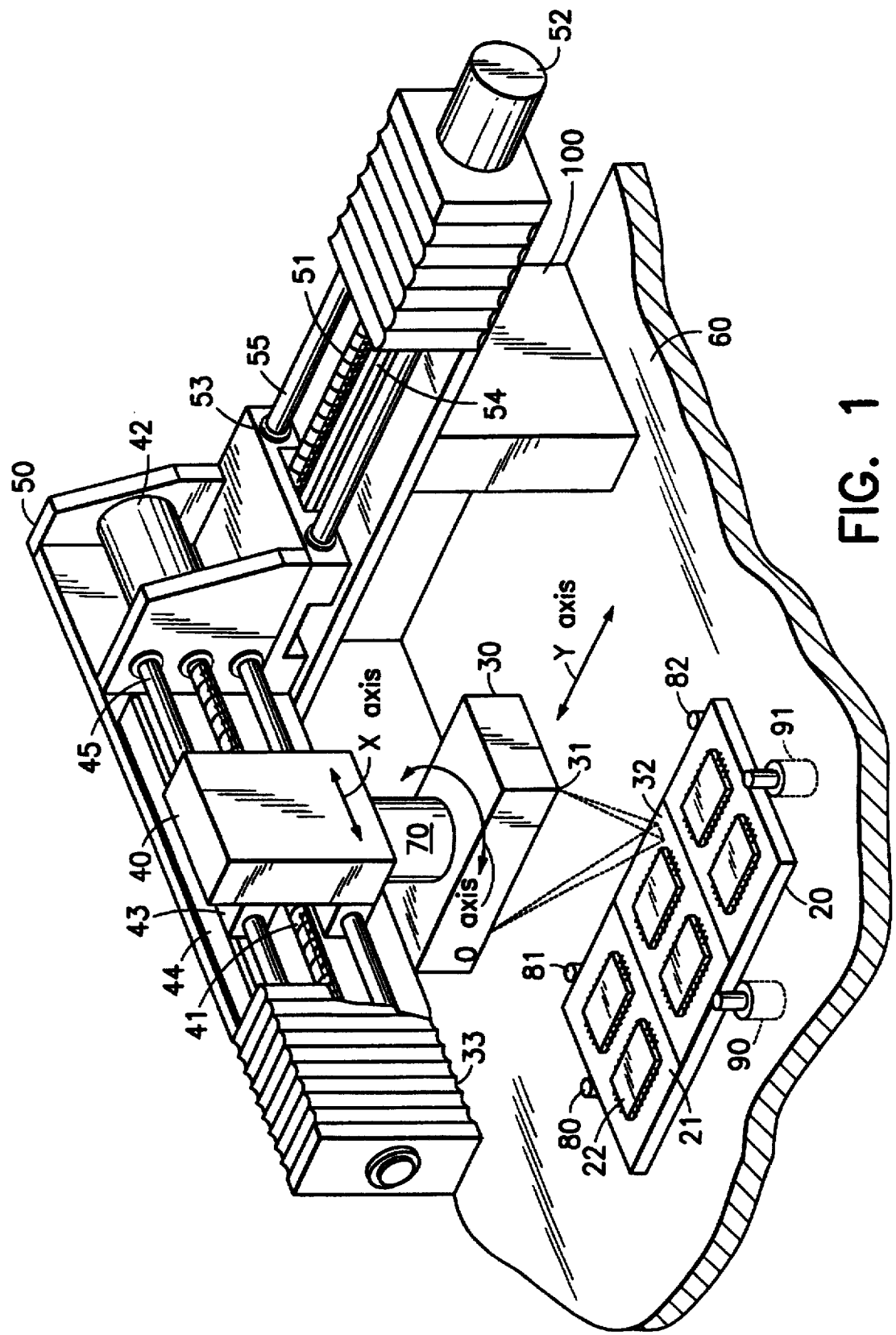
FIG. 1 is a schematic view of the preferred embodiment of the invention and shows a 3-D sensor system mounted to an X-Y-motion system along with a tray of devices to be scanned that are located in an assembly suitable for banking the parts against the walls of the tray compartments.

FIG. 1 shows components used in practice of the invention. The 3-D Sensor 30 is attached to an x, y, theta motion mechanism 100, which is mounted to plate 60 which forms the base for the tray of devices and the banking pins 80, 81, 82 and the lift and vibrate units 90 and 91. The y carriage 50 is driven by motor 52 via lead screw 51 and supported by linear shaft 55 and bearings 53. The y linear encoder 54 is used to extract exact positional information as the table is driven. The y carriage 50 forms the base for the x axis drive motor 42, x axis lead screw 41 and the x axis linear shafts 45. The x axis head 40 is supported by linear bearings 43 and its position indicated continuously by linear encoder 44. The x axis head 40 supports rotary theta axis 70 which in turn supports 3-D sensor 30. Light plane or flying spot projector 31, internal to sensor 30, projects a light plane or series of spots which illuminate the surface of tray 20 at the line or equivalent series of spots 32. Individual semiconductor devices 22 that are to be inspected lie in tray pockets 21.

Figure 2:
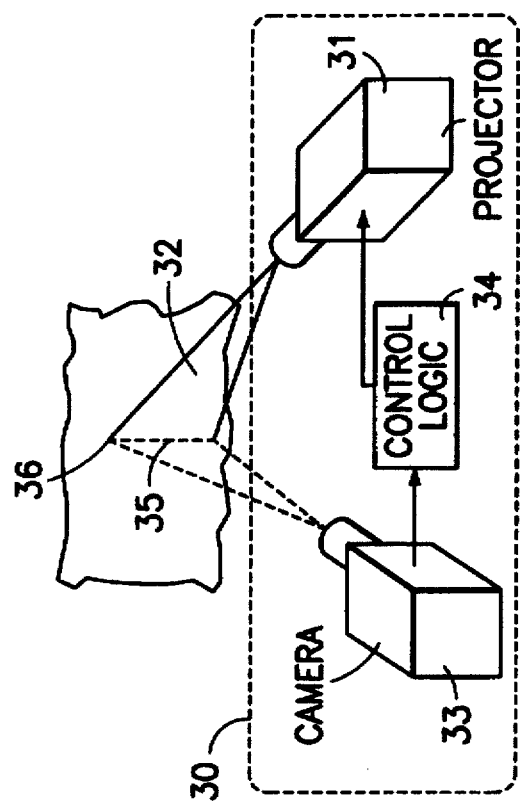
FIG. 2 is a schematic showing the use of a camera and plane of light projector which illustrates a basic 3-D sensor construction.

FIG. 2 shows a detail schematic of the sensor 30, camera 33, projector 31, control logic for timing and light control 34 and light plane 32. The light spots 35 that can substitute for the light plane 32 when using the alternate of a flying spot projector 31 are also shown. As can be appreciated from the FIG. 2 schematic, the mechanical scan motion must be approximately at right angles to the line of intersection of the plane of light with the object, 36, in order to scan a swath of reasonable width. This is the reason for the rotary axis 70 in FIG. 1. The rotary axis is turned according to the direction of mechanical scan to keep the line of intersection approximately at a right angle with the direction of motion. If the motion is restricted to pure scans in the x direction and y direction only, then the rotary axis may be eliminated and the sensor head replaced with one containing two 3-D sensors at right angles to each other. One sensor would be oriented so that its light plane is positioned properly for x scan motion and the other would be positioned to have its light plane oriented properly for y scan motion. Sensor output would be chosen according to the direction of scan.

Figure 3:
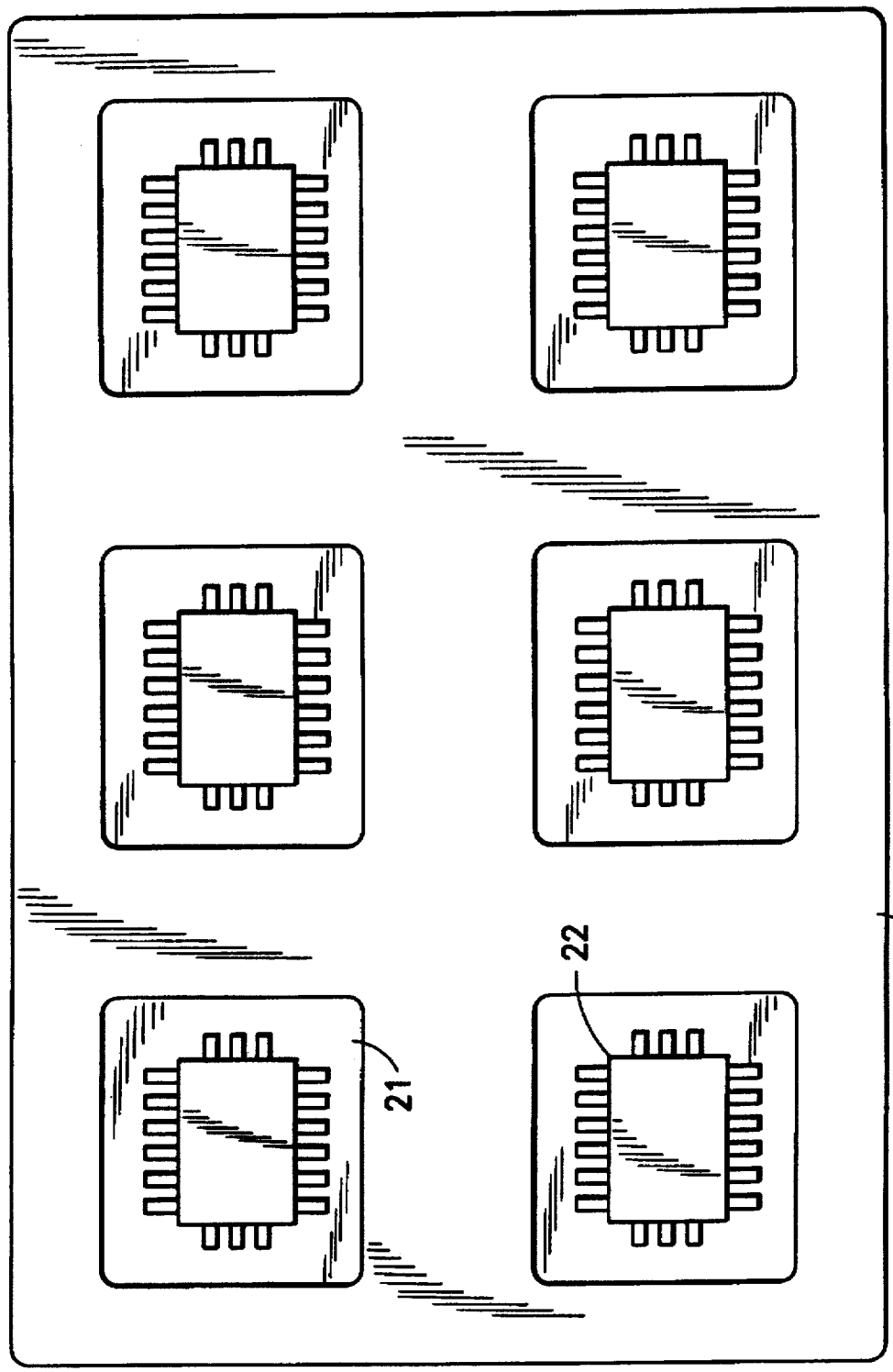
FIG. 3 is a top view of a tray of devices with all devices centered in their respective pockets.

FIG. 3 shows the appearance of devices 22 which are located exactly in the center of their respective pockets 21 in tray 20. The devices are also shown with their sides exactly parallel to the sides of the pocket. This is the appearance in the ideal case and may actually occur when the tray pockets are only marginally larger than the devices. Making the pockets only marginally larger than the devices is not necessarily a good practice because it may lead to damage to the fragile leads when inserting the device 22 into the pocket 21.

Figure 4:
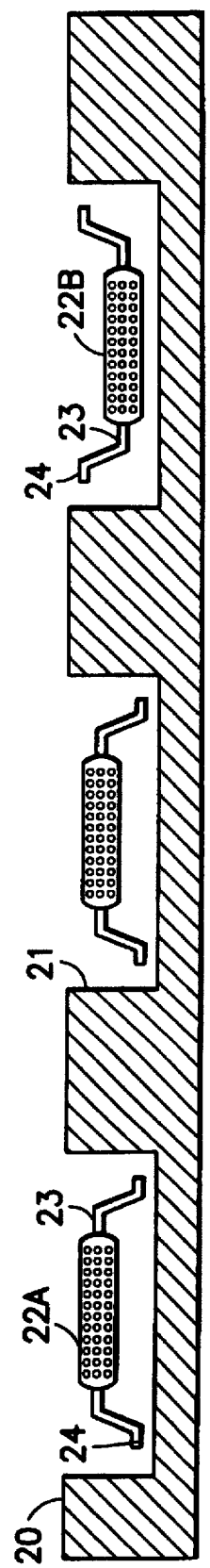
FIG. 4 is a section view of a tray of devices showing live bug and dead bug part positioning.

FIG. 4 is a cross section view of the tray 20 showing the relationship between the pockets 21, the devices 22A and 22B and the device leads 23. As is illustrated, the devices may be inserted into the tray either right side up, 22A (live bug) or up side down, 22B (dead bug). Also shown is the region of the leads that is most critical to semiconductor quality with regard to placement of the lead tips 24 on a printed circuit board. Because the exact location of the lead tips 24 is very critical, it is desirable to scan them at the highest possible resolution. This entails crowding as many 3-D data points as possible into the region encompassing the lead tips 24 and is the equivalent of using a high magnification when performing inspection with 2-D machine vision.

Figure 5:
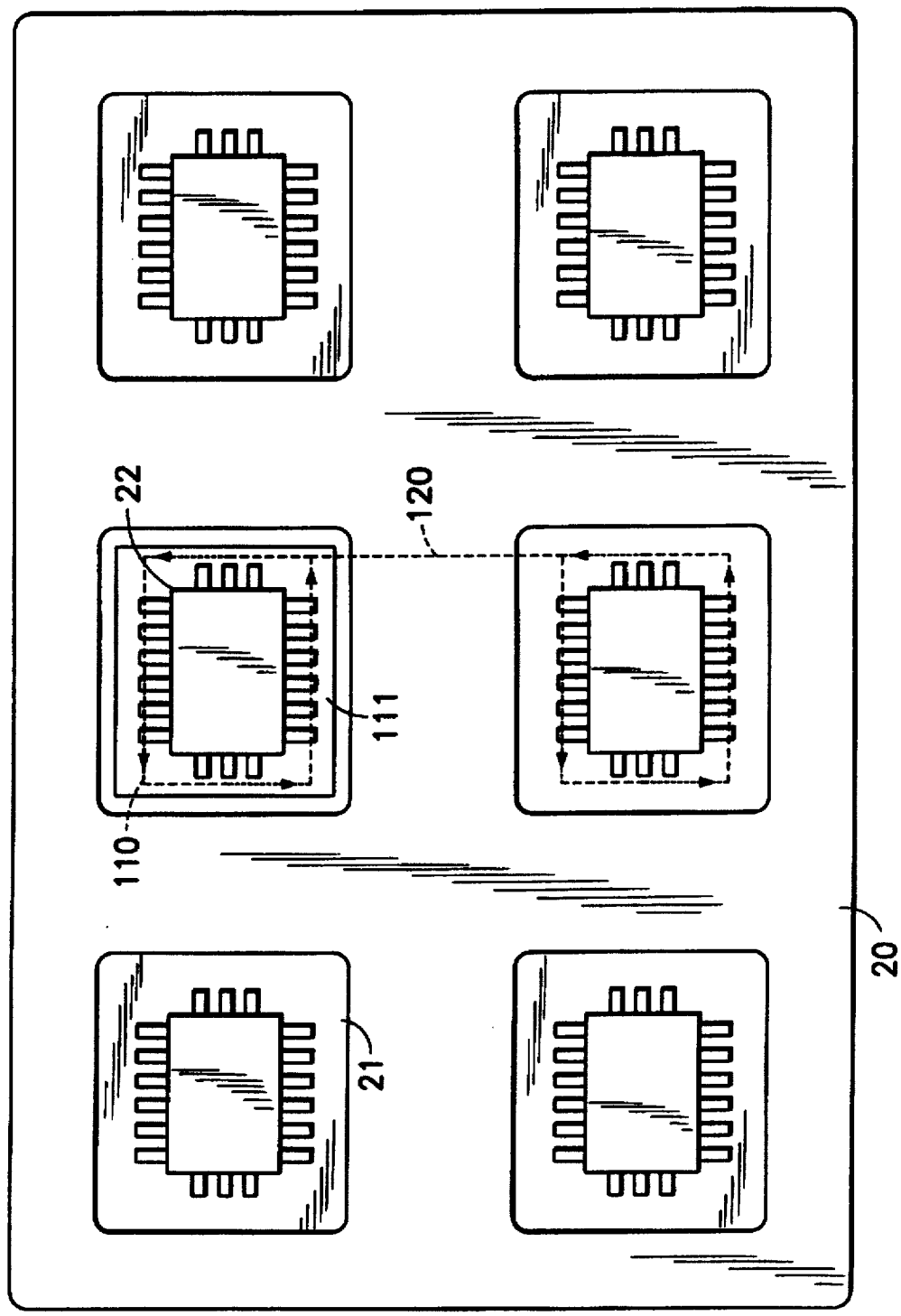
FIG. 5 is a top view of a tray of centered devices showing the 3-D sensor scanned area and the path used to gather data from the lead tips of two devices.

FIG. 5 shows a top view of the tray 20, pockets 21, centered devices 22 and a scan path around a device, 110, which produces a scanned area 111 encompassing the lead tips 24, which satisfies the requirement for obtaining detailed high resolution 3-D data. This method of scanning which is commonly employed is severely encumbered by the need for frequent acceleration and deceleration and additionally requires that the sensor be rotated (when an arrangement with one 3-D sensor in the head and a rotary axis is used) for each of the four straight line segments making up the rectangular donut-shaped scan area 111. Similarly, each of the segments requires that one axis, either x or y, be accelerated up to scan velocity and then be decelerated to a stop. During each scan corresponding to a segment the 3-D data for the lead tips 24 on one side of a device are captured. The number of acceleration/deceleration pairs required is equal to a minimum of four times the number of devices since each device has four sides. Each acceleration/deceleration pair adds a significant mount of extra time to the scan time which would otherwise be needed; the result is performance that is significantly degraded from what would be predicted by scan time requirements alone. This does not take into account the acceleration decelerations that are required to travel from device to device.

Figure 6:
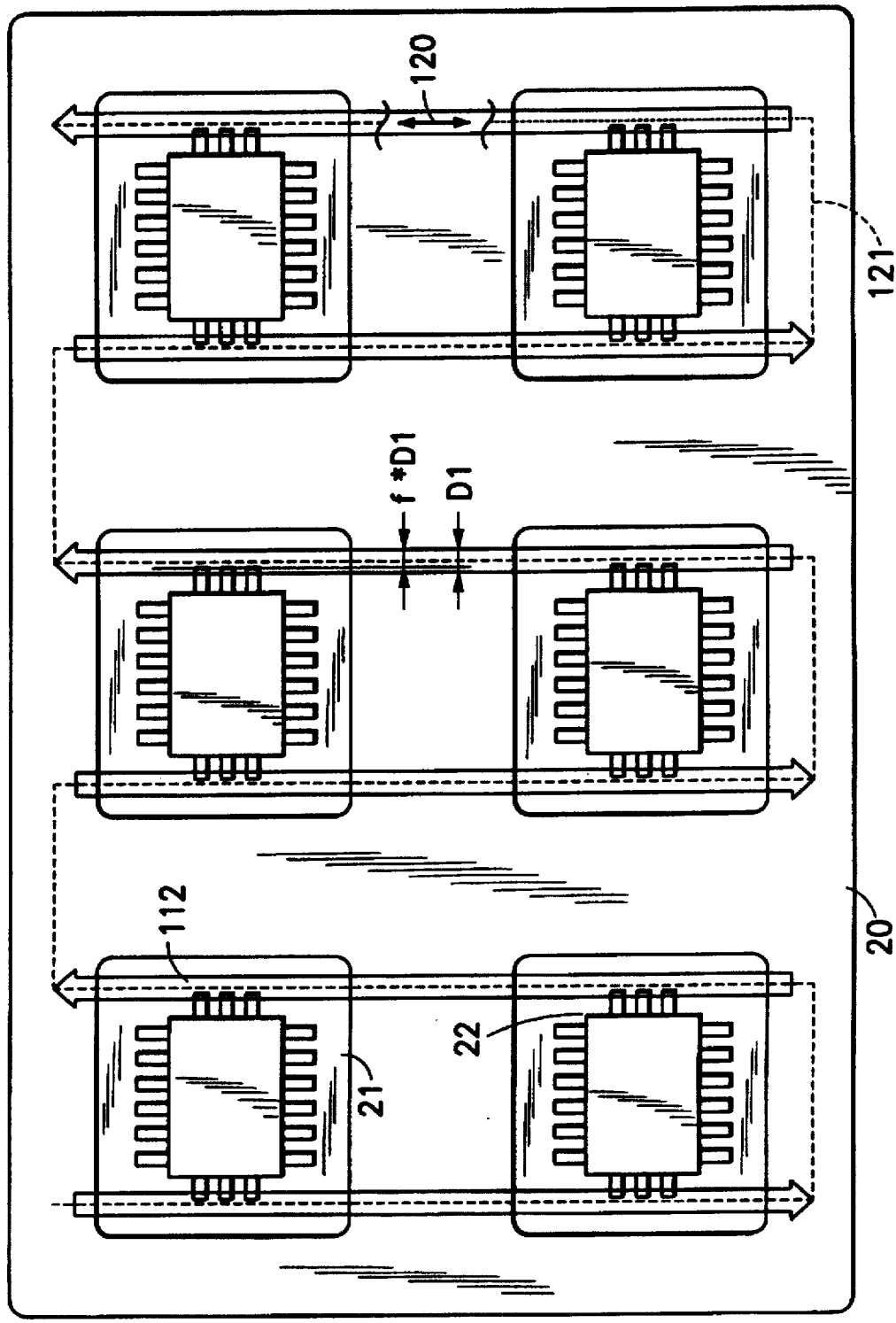
FIG. 6 is a top view showing the 3-D sensor scanned area and the path used to scan the lead tips on the short sides of the devices when they are centered in their respective pockets.
Figure 7:
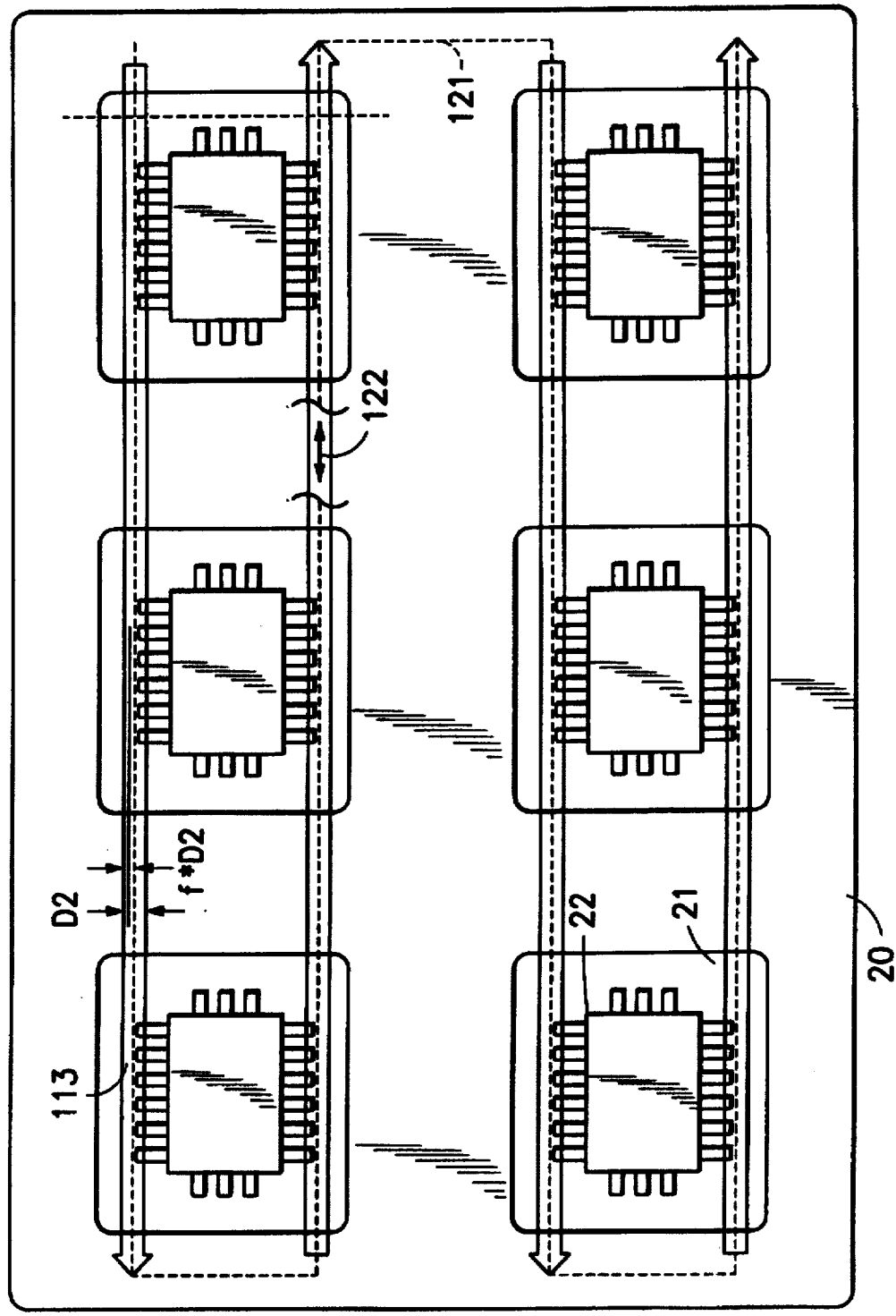
FIG. 7 is a top view of the 3-D sensor scanned area and the path used to scan the lead tips on the sides of the devices when they are centered in their respective pockets.

FIG. 6 and FIG. 7 show the top view of the same tray 20 with centered devices 22 in tray pockets 21 but the scan area segments now extend contiguously across several devices along the short dimension of the tray (112 in FIG. 6) and along the long dimension of the tray (113 in FIG. 7). This reduces the number of straight-line segments (and therefore acceleration/deceleration pairs) drastically, since the pairs now number two times the sum of the number of rows plus columns. This does not take into account the acceleration/decelerations that are required to travel from one scan to the next but the number of such short paths, 121, are far fewer than the number of moves between devices, 120, in the previous method. For instance, a tray with eight rows of sixteen devices in each row (e.g., 16 columns) would hold 128 devices and would require therefore at least 512 acceleration/deceleration pairs in scanning according to the FIG. 5 pattern. However, in the method shown in FIGS. 6 and 7 only 48 acceleration/deceleration pairs are required which is equal to the sum of the rows and columns multiplied by two. Further, although FIGS. 6 and 7 make it appear that there is substantial wasted scan path between devices this can be seen to lessen significantly as the number of rows and columns increase. Further, since 3-D data need not be taken in the intervals (122) and these areas are remote from areas where 3-D data must be taken (areas with leads) the motion or scanning velocity may be significantly increased during travel over these intervals without concern for induced vibration, etc. In FIG. 6 and FIG. 7 dashed lines have been placed in scan paths where it is not necessary to take 3-D data. This convention has been followed in all subsequent drawings.

FIG. 6 and FIG. 7 also identify the desired width of the short scans, D1, and the desired width of the long scans, D2, respectively. Further, associated with each such scan is a fraction, f, of the scan width that is required as overscan—scan that is desired to insure that enough 3-D data exists to allow proper identification of the exact ends of the lead tips.

Figure 8:
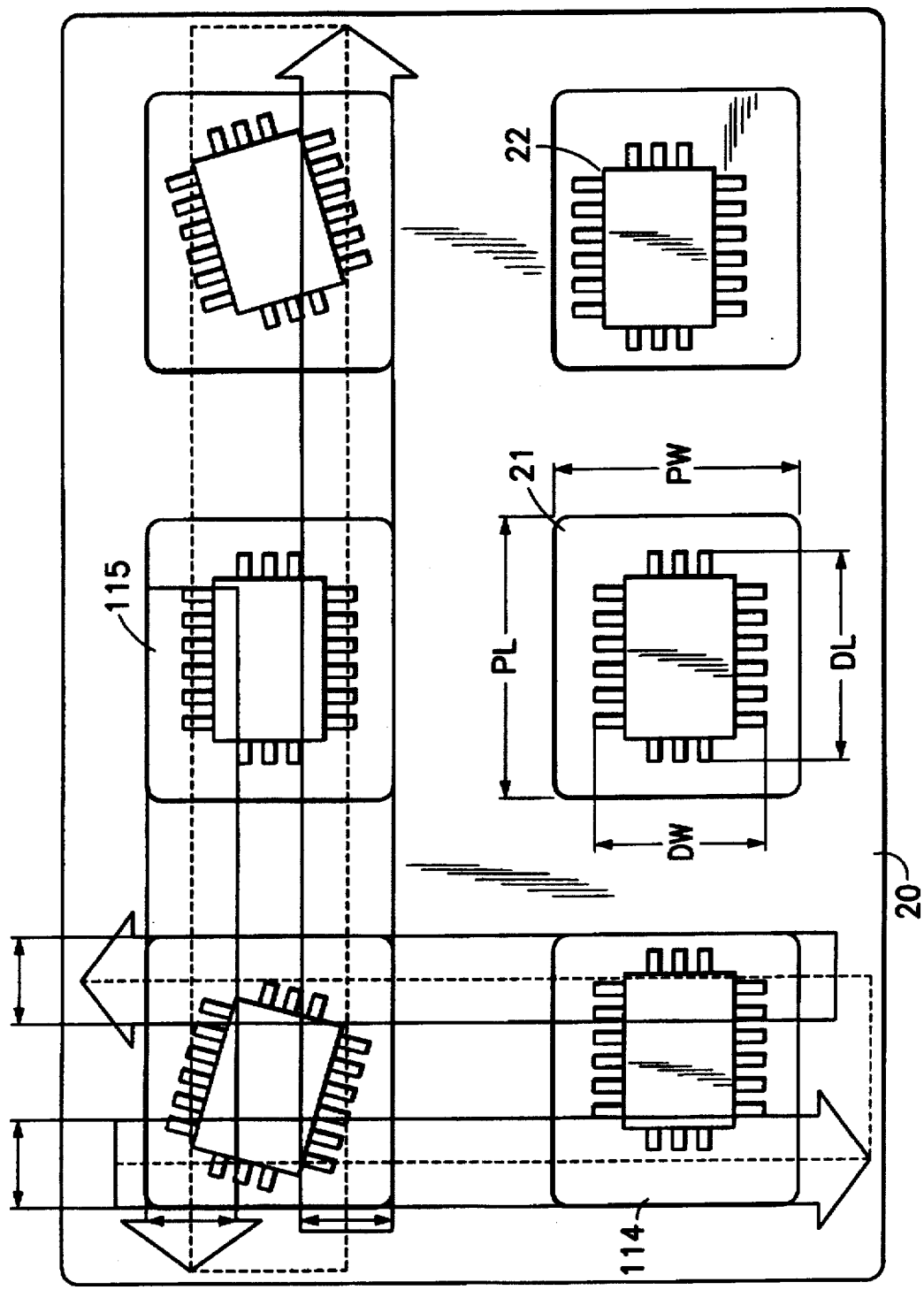
FIG. 8 is a top view showing a random arrangement of parts where they are not centered in their respective pockets and illustrative of the relationship between the part dimensions and the pocket dimensions.
Figure 9:
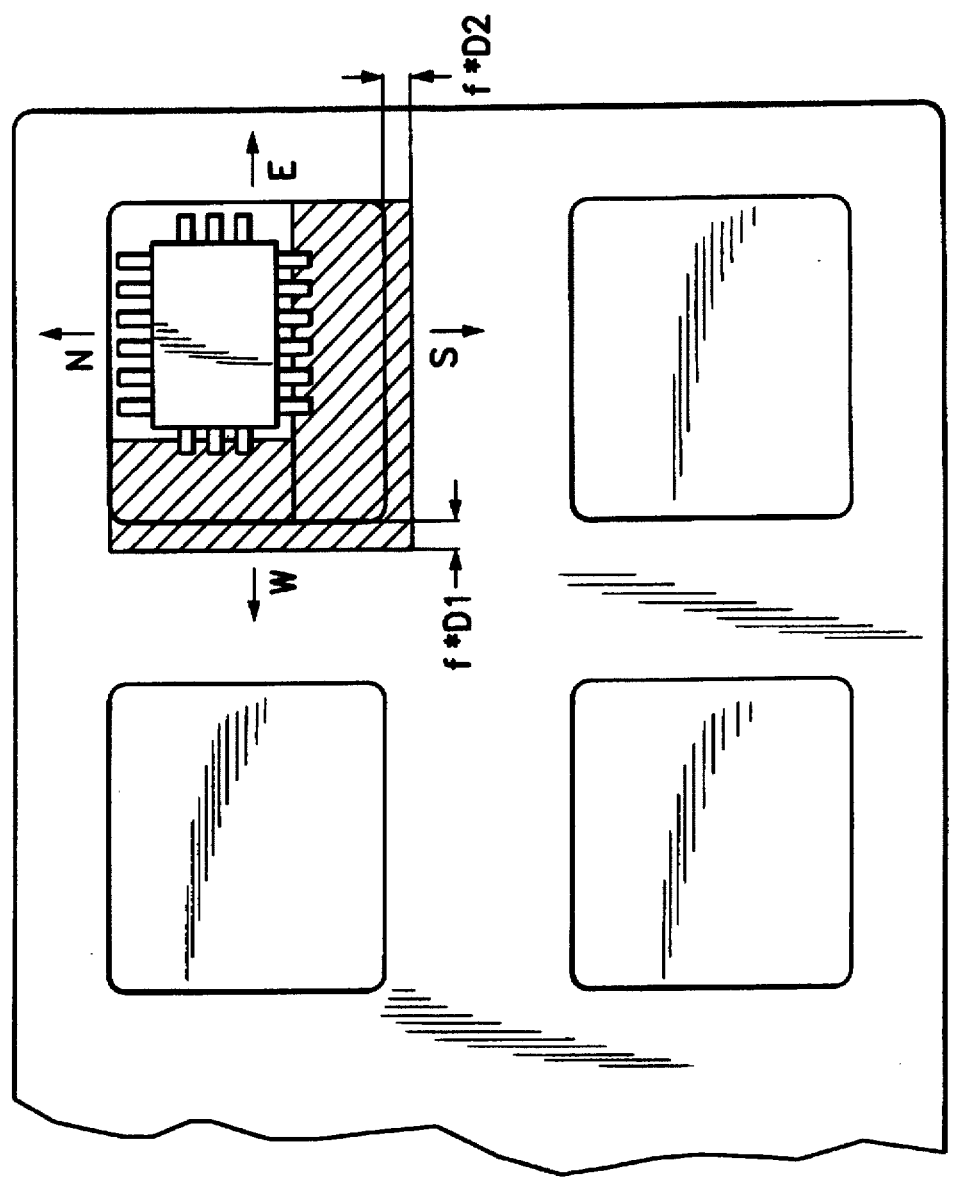
FIG. 9 shows a top view of the worst case scan area that must be covered to ensure gathering data for the lead tips on two orthogonal sides of a device in an unknown position in a pocket.

FIG. 8 shows the tray 20 with devices 22 that fit loosely in the pockets 21 so that the devices are significantly rotated and translated with respect to the known positions of the tray pockets. FIG. 8 also identifies key dimensions of the devices 22 and the pockets 21. It can be immediately seen that since there is no knowledge of exactly where the leads are located in the pocket, it is necessary to perform a significant amount of overscanning to insure that the lead tips are scanned and 3-D data obtained. The widened scan areas are shown (114, 115) in FIG. 8. Given that the pocket length and width are PL and PW, respectively, and that the device length and width are DL and DW, respectively, we can compute the overscan required. The maximum linear motion of the leads can be seen to occur when the device is banked to diagonally opposite corners of a pocket. This case is shown in FIG. 9. The device is shown banked to the upper right hand side of the pocket. It can be immediately seen that if the devices were to be banked in the lower left corner of the pockets, the device motion would be PW−DW in the x direction as defined in FIG. 1 and PL−DL in the y direction as defined in FIG. 1. The width of each of the areas to be scanned will therefore increase to PL−DL+f*D1 in the y direction (from D1) and will increase to PW−DW+f*D2 in the x direction (from D2). The terms f*D2 and f*D1 come from the lead tip overscan as defined in FIG. 6 and FIG. 7, respectively.

Figure 10:
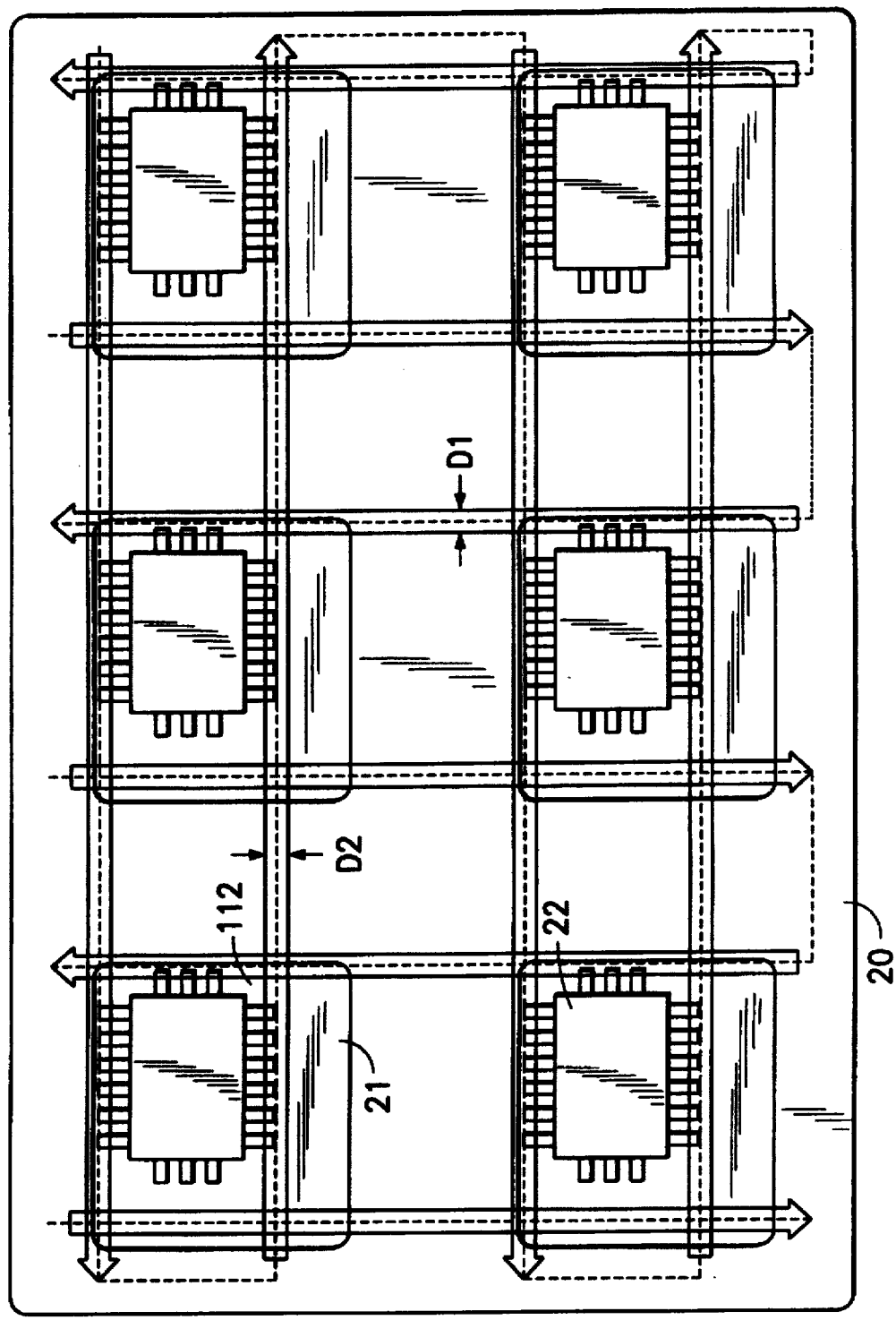
FIG. 10 is a top view illustrative of the devices in a tray when they are all banked to the same corner of their respective pockets and the resulting scanned areas and paths that may be employed when scanning the lead tip.

The scan areas as expanded by uncertainty introduced by the loose fit of devices in the tray pockets can be significant multiples of the original areas that had to be scanned when the devices were fixed in known positions. Accordingly, it is a further objective of the present invention to remove the uncertainty by always banking the devices to the same known corner of their respective pockets before the scanning process is begun. This is shown in FIG. 10, along with new scan paths that are translated versions of the FIG. 6 and FIG. 7 scan paths where the translations are those required to account for the shift of the devices from the center of the pockets to one corner of the pockets. The new scan paths are therefore shifted in x by one half of (PW−DW) and shifted in y by one half of (PL−DL). Banking of the devices to a known corner and the shifting of the rectangular scan pattern of FIG. 5 according to such banking will significantly improve the scan time required as compared to adding new areas to be scanned when the devices are loosely located in the pockets.

Figure 11:
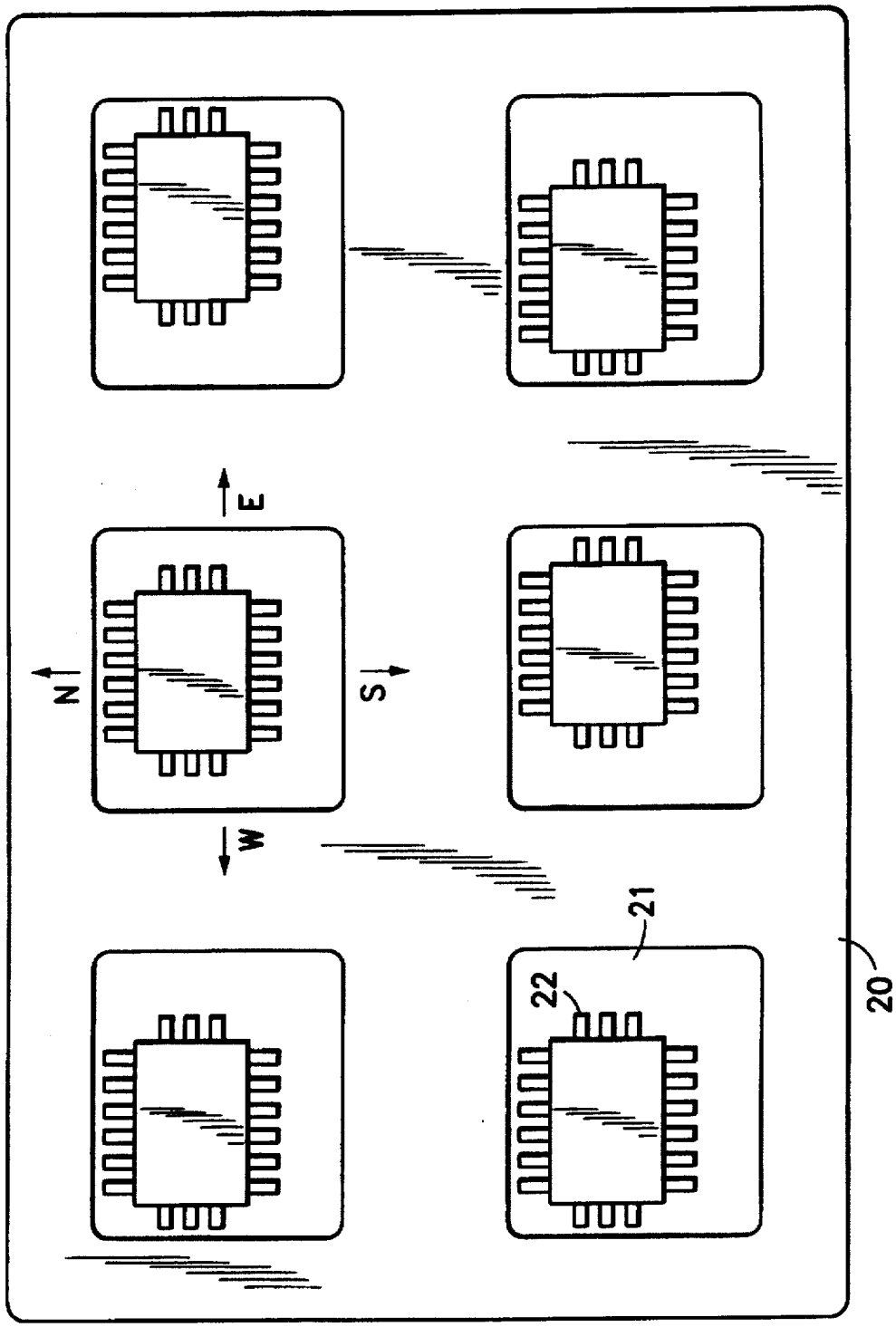
FIG. 11 is a top view illustrative of the devices in a tray when they are banked against the long side of the pocket only.

An alternative method of compensating for devices that are loosely located in pockets is to bank the devices to one side of the pockets rather than to one corner. This method is particularly useful when the devices are relatively tight in the pocket in one direction but relatively loose in the other. Accordingly, banking against the wall of the pocket in the loose direction of fit is all that is required to remove the necessity of otherwise increasing the scan area in such cases. Even if there is looseness in both directions, banking against one wall will significantly reduce the amount of overscan that would otherwise be required. This is shown in FIG. 11 where the devices are shown banked against the long wall of the tray pockets. Such a configuration would be handled using long narrow (normal) scans (see 113 of FIG. 7) in the y direction and the short wide (due to overscan) scans 114 of FIG. 8 in the x direction.

Figure 12:
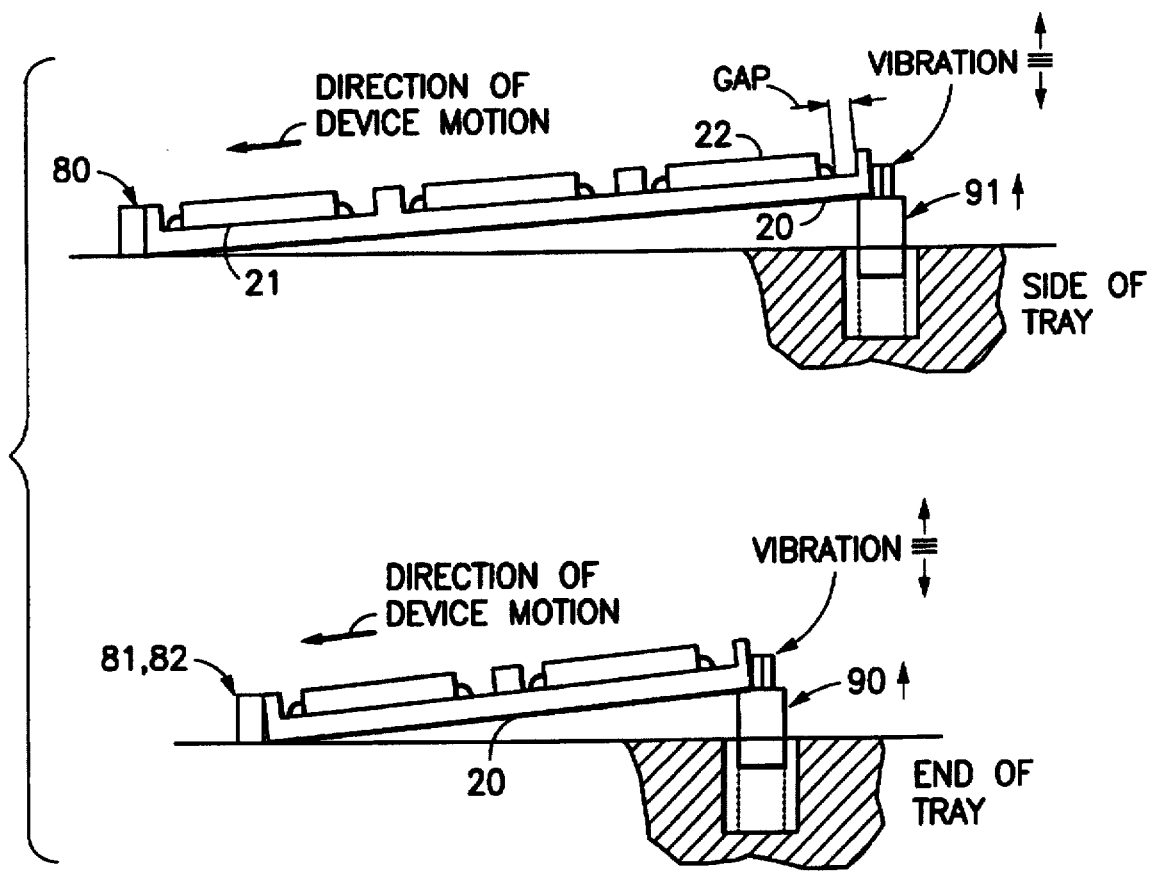
FIG. 12 is a section view of a lift and vibration device that banks the devices against the lower walls of their respective pockets (parallel to the short side of the tray).

A useful apparatus for accomplishing the banking of devices against the pocket walls and/or corners is shown in FIG. 1 and FIG. 12. Banking pins for the tray, 80 on the short side of the tray and 81, 82 on the long side of the tray prevent sliding tray motion when lift and vibration units 91 on the short side and 90 on the long side are activated.

Figure 14:
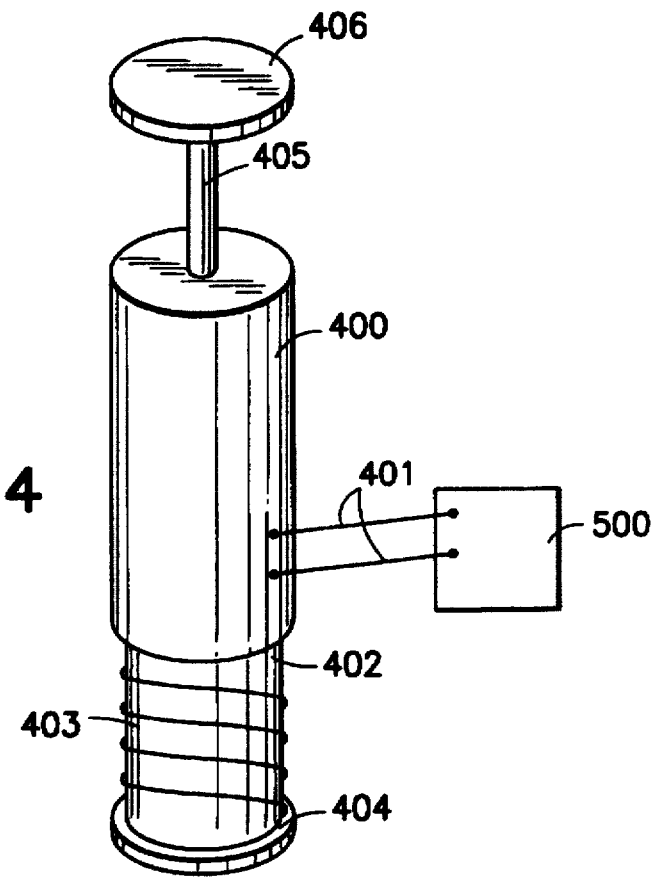
FIG. 14 is a schematic view of a solenoid lift and vibration unit.

Each lift and vibrate unit may be made up of a commercial push type solenoid as shown in FIG. 14 which consists of a barrel-covered solenoid coil 400 with attached wires 401, solenoid plunger 402 with lip 404, solenoid return spring 403, and end plate 406 connected to solenoid plunger 402 via push rod 405. With no current through the solenoid coil, the lift and vibrate unit is kept in the fully-retracted position by return spring 403. When energized with current the solenoid plunger is drawn into the push rod and end plate.

Each lift and vibration unit lifts one edge of the tray when its solenoid mechanism is activated with a D.C. current that slowly rises to a value required to lift the edge to the desired height. Upon reaching the desired height the current is modulated with a small A.C. component that draws the plunger slightly into the body of the solenoid and then raises it again to produce a cyclic vibration of relatively small amplitude. It can be seen that the result will be to raise one edge of the tray from its position flat on table 60 to a nominal height, and then vibrate the tray from static zero to a maximum value and then slowly decreases to zero friction holding the devices is broken, whereupon all devices will slide with gravity's assistance to the lower wall of the pocket. The D.C. current is then slowly reduced to zero. This gently lowers the tray which now has all of its devices banked to one side, back to the horizontal position.

For instance, starting with a tray of devices that are randomly oriented in their pockets (see FIG. 8), the lift and vibrate mechanism 90 is activated to go through the complete cycle outlined above. This will result in the tray configuration of FIG. 11 where the devices are banked against the long side. The lift and vibrate unit 91 may now be activated to go through a similar cycle which will bank the devices against the short sides of the pockets; the devices will now be banked against the pocket corners as shown in FIG. 10. Other forms of vibration and lifting (including one tray corner) may be employed (including directional vibration which is well known and used in part feeders) to achieve the same ends; banking of the devices against the tray pocket walls or corners.

Figure 13:
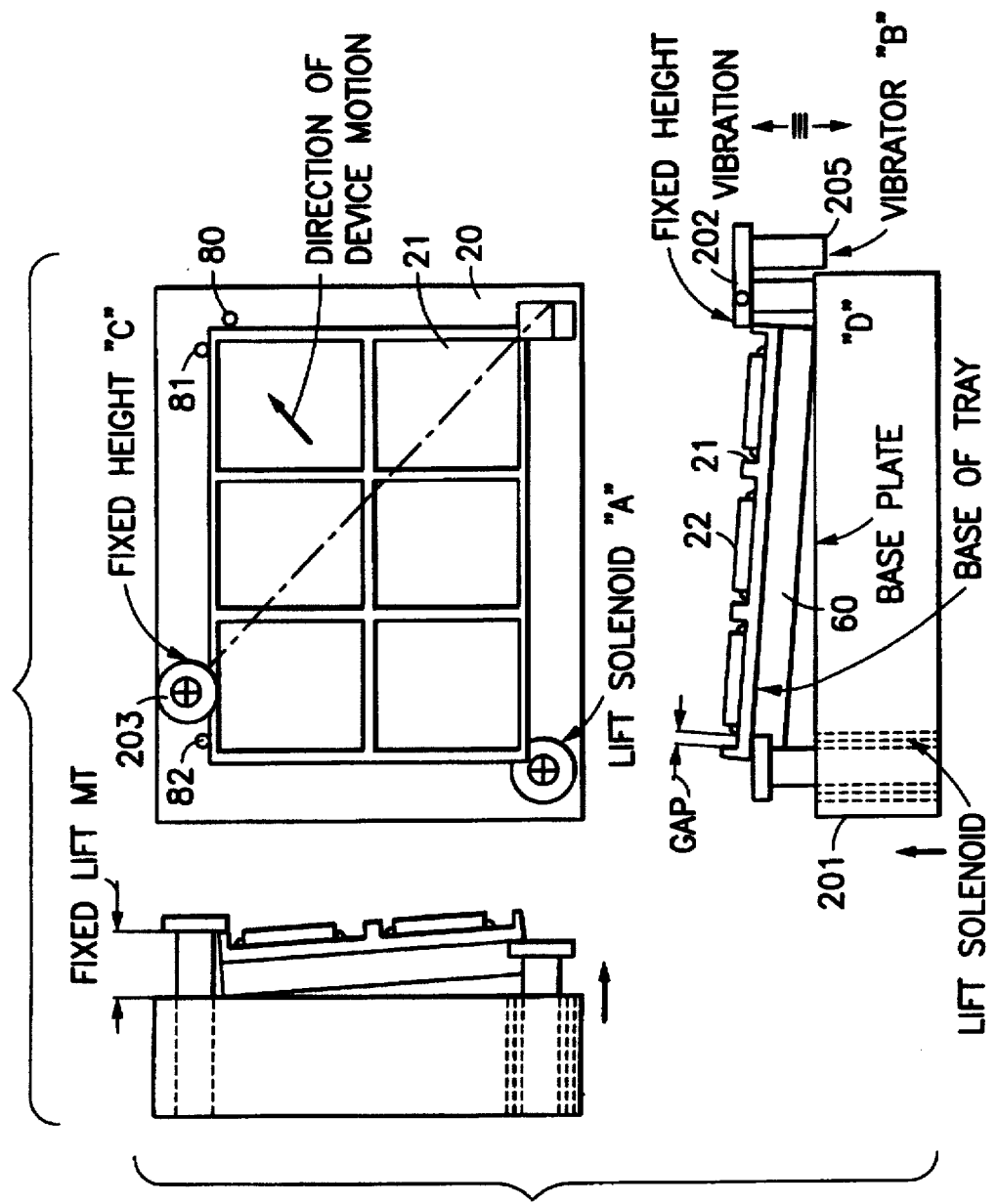
FIG. 13 is a section view of a lift and vibration device that banks the devices against the lower walls of their respective pockets—parallel to the long side of the tray.

FIG. 13 shows the tray 20 with devices 22 that are loosely in the pocket 21. This method banks the devices on two walls of the tray pockets 21. Banking pins are provided for the tray 20 on two walls of the tray pockets 21. Banking pin 80 for the tray 20 on the short side of the tray and 81, 82 on the long side of the tray locate the tray 20 in position when lift and vibration is activated. Solenoid 201 is raised, forcing the tray 20 against the fixed post 203 and vibration beam 202.

Vibration actuator 205 builds up an aptitude of vibration of constant force for a short time and then decreases. After the devices 22 are in position, the tray is lowered gently onto the base place 60 by retracting solenoid 201.

Figure 15:
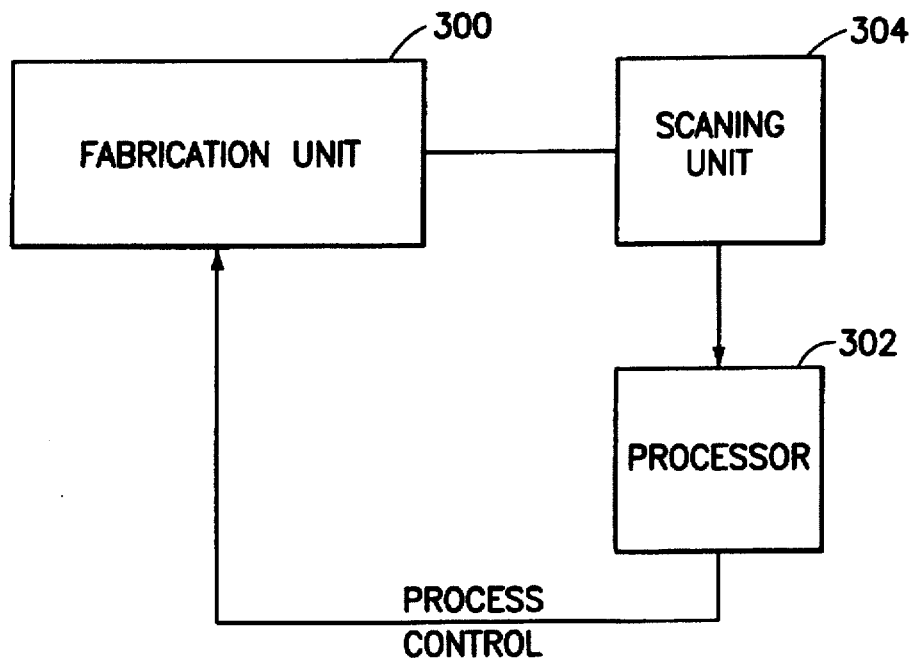
FIG. 15 is a system depiction showing the system with which manufactured semiconductor devices are scanned, compensation for manufacturing deviation effected to the fabrication unit.

The invention and the acquisition of data related to semiconductor device construction possible because of the scanning employed, allows semiconductor device fabrication to be more surely controlled with effective elimination of manufacturing operation faults that produce defective devices and as will be described next and with reference being had during ensuing description to FIG. 15.

A semiconductor fabrication unit 300 of construction know to one of ordinary skill in the art has its operation controlled by a processor 302. Semiconductor device making as is known has become highly automated as to machine function so processor control and intervention to the manufacturing operation easily is done. Manufactured devices are required to be precision components having geometries of precise predetermined nature. Of particular interest is the geometry of lead pins on the devices, these lead pins requiring, inter alia, particular spacing between pins as well as pin coplanarity. Deviation or departure of values relating to pin spacing and coplanarity are cause to reject a semiconductor device as defective until required pin straightening, if possible, can be effected.

Semiconductor devices fabricated in unit 300 will be generally aligned in rows and columns of such, one way of doing this being to receive the devices as they are manufactured in trays, the trays having columns and rows as described earlier.

Using the sensor means and scanning apparatus 304 (greater detail thereof being depicted in FIG. 1), the devices will be scanned along corresponding device structure features in row and column course and in consequence three-dimensional device geometry data will be acquired. In the case where the structure feature is lead pin geometry, the data will pertain to pin spacing, pin coplanarity or whatever other device geometry feature is of interest and determinative of precision of device manufacture.

Figure 16:
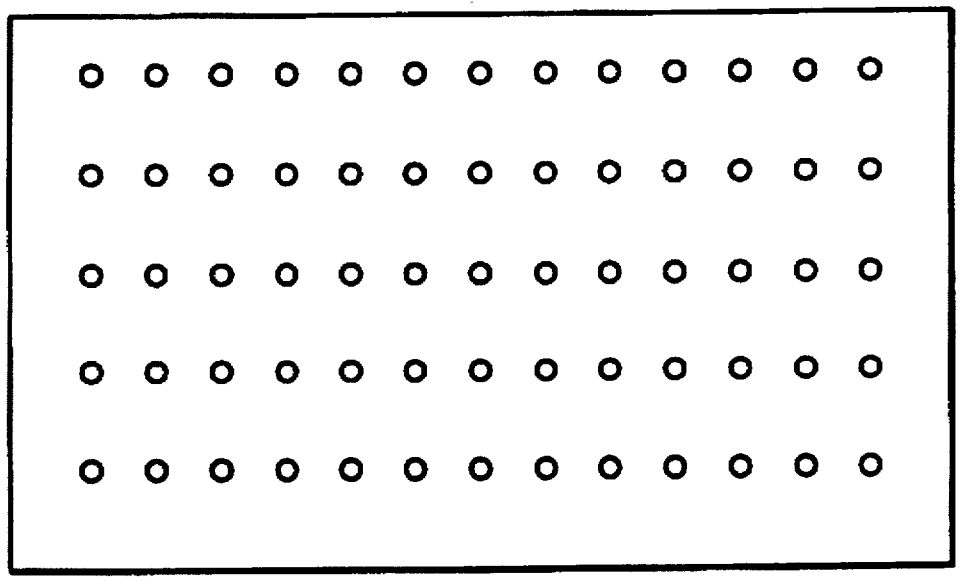
FIGS. 16 and 17 depict other forms of devices wherein fabrication of devices can be controlled in accordance with the invention, the Figs., respectively, showing a semiconductor device pin array, and a ball grid array of solder deposits there being need that both such have precise characteristics.
Figure 17:
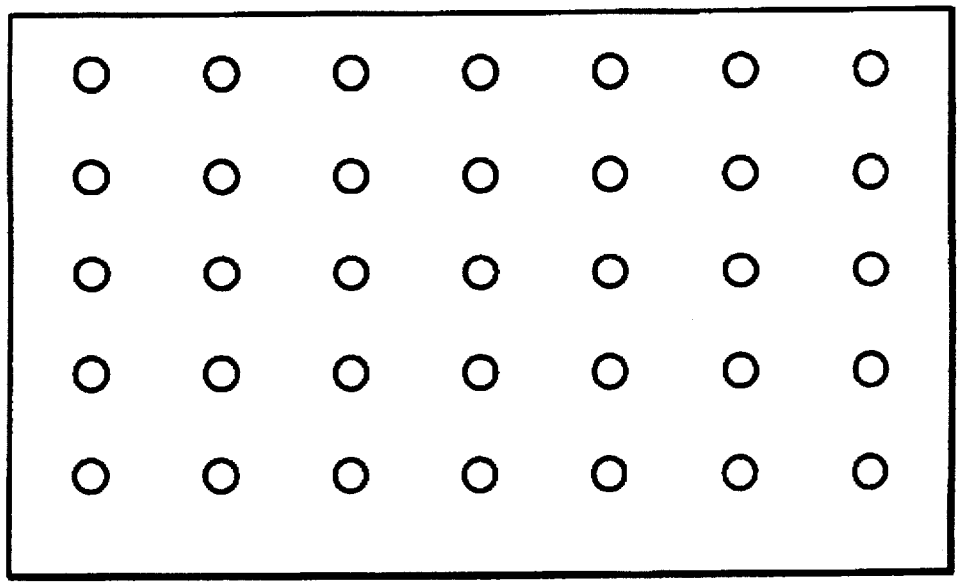

It will be understood that "corresponding device structure feature" as used herein means a same element of the structure of a device or part of a device which is found on each and is identical with that of another device. For example, the structure feature can be the lead pins extending laterally of one or more of the sides of a semiconductor device. It also could simply be a side of a device. Other structure features of interest for presence thereof as well as geometry of same include the pin-grid array on a device 310 as shown in FIG. 16 and a ball-grid array of solder deposits 312 on a board 314.

Further scanning of all other rows and columns of device corresponding structure will be carried out to acquire further three-dimensional device geometry data.

All such acquired geometry data will be input to processor 302 wherein the actual device geometry is compared with a predetermined desired geometry. Deviation or departure of the actual from the predetermined indicates the manufacturing operation is at fault and correction should be effected. This will be done with a signal indicative of the geometry differences and employed as a control to the fabrication unit, the result being the making of operation adjustment to eliminate the condition in the unit operation that caused deviation.

Thus the scanned inspection of the devices is used to insure proper device fabrication and optimum quality control.

Where defective semiconductor devices are produced by the fabrication unit, it is necessary that each and all such be removed from the manufacture line to a discard or a repair operation. In this manner, all trays leaving the scanning and discard operation are guaranteed to satisfy inspection criteria. The discard operation is controlled by processor 302 as part of the overall manufacturing operation. A useful further step includes automatically replacing all devices discarded from a tray with known-good devices, whereby all trays leaving the operation not only contain only devices which have passed inspection, but all trays leaving the operation have all pockets filled with known-good devices.

The devices being inspected, and the types and locations of elements of the devices being inspected may be of any type, now in use, or later to be developed. Although the foregoing description is cast in the environment of inspecting leads at the edges of integrated circuits (dead bug, live bug), one skilled in the art, with the benefit of the present invention, will recognize that such a limitation is not a necessary part of the invention. Present technology includes devices such as, for example, ball-grid-array (BGA) and pin-grid-array (PGA) devices in which, instead of the items to be inspected being located along edges, or about a perimeter of the device, such items are arrayed in a two-dimensional pattern generally within the perimeter of the devices, rather than at their edges. According to the present invention, such devices are inspected by the present invention by aligning two or more devices in a row and/or a column, with rows or columns of items within the perimeter of one device aligned with corresponding rows or columns of an adjacent device, whereby the basic principle of the present invention, of linearly scanning along an unbroken path which includes elements to be inspected in more than one device, is satisfied.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. Apparatus for obtaining three-dimensional data from devices having corresponding elements, said elements being arranged in at least one of a row and a column, comprising:

means for receiving a multi-pocketed tray;

said multi-pocketed tray having a plurality of tray pockets arranged in at least one of rows and columns;

said tray pockets being adapted for receiving a plurality of said devices;

said tray pockets holding a plurality of said devices with corresponding elements of at least first and second devices being aligned in at least one of a two-device row and a two-device column;

a three-dimensional sensor; and scanning means for scanning said three-dimensional sensor along at least one of said two-device row and said two-device column, such that data from corresponding elements of said two-device row or said two-device column are obtained in a straight-line scan.

2. Apparatus as in claim 1, further comprising:

vibrating means for generating directional vibration; and means for applying said vibrating means to said tray for driving all said devices to a same corner or side of respective tray pockets whereby said devices become aligned.

3. Apparatus for obtaining three-dimensional data from devices having corresponding elements, said elements being arranged in a row, comprising:

means for receiving a multi-pocketed tray;

said multi-pocketed tray having a plurality of tray pockets arranged in at least one row;

said tray pockets being adapted for receiving a plurality of said devices;

said tray pockets holding a plurality of said devices with corresponding elements of at least first and second devices being aligned in at least a two-device row;

a three-dimensional sensor; and scanning means for scanning said three-dimensional sensor along said at least two-device row, such that data from corresponding elements of said two-device row are obtained in a straight-line scan.

4. Apparatus as in claim 3, further comprising:

vibrating means for generating directional vibration; and means for applying said vibrating means to said tray for driving all said devices to a same corner or side of respective tray pockets whereby said devices become aligned.

5. Apparatus for obtaining three-dimensional data from devices having corresponding elements, said elements being arranged in a column, comprising:

means for receiving a multi-pocketed tray;

said multi-pocketed tray having a plurality of tray pockets arranged in at least one column;

said tray pockets being adapted for receiving a plurality of said devices;

said tray pockets holding a plurality of said devices with corresponding elements of at least first and second devices being aligned in at least a two-device column;

a three-dimensional sensor; and scanning means for scanning said three-dimensional sensor along said at least two-device column, such that data from corresponding elements of said two-device column are obtained in a straight-line scan.

6. Apparatus as in claim 5, further comprising:

vibrating means for generating directional vibration; and means for applying said vibrating means to said tray for driving all said devices to a same corner or side of respective tray pockets whereby said devices become aligned.

7. Apparatus for obtaining three-dimensional data from devices having corresponding elements, said elements being arranged in a row and a column, comprising:

means for receiving a multi-pocketed tray;

said multi-pocketed tray having a plurality of tray pockets arranged in at least one row and at least one column;

said tray pockets being adapted for receiving a plurality of said devices;

said tray pockets holding a plurality of said devices with corresponding elements of at least first and second devices being aligned in at least one row and column;

a three-dimensional sensor; and scanning means for scanning said three-dimensional sensor along at least one of said at least one row and said at least one column, such that data from corresponding elements of said one of at least one row and said at least one column are obtained in at least one straight-line scan.

8. Apparatus as in claim 7, further comprising:

vibrating means for generating directional vibration; and means for applying said vibrating means to said tray for driving all said devices to a same corner or side of respective tray pockets whereby said devices become aligned.

* * * * *